United States Patent [19]

Agoston et al.

[11] Patent Number: 4,727,340
[45] Date of Patent: Feb. 23, 1988

[54] COMB GENERATORS

[75] Inventors: Agoston Agoston, Beaverton; Stanley P. Kaveckis, Aurora, both of Oreg.

[73] Assignee: Tektronix, Inc., Beaverton, Oreg.

[21] Appl. No.: 858,485

[22] Filed: Apr. 30, 1986

[51] Int. Cl.$^4$ .............................. H03B 5/00; H03K 3/00
[52] U.S. Cl. ................................. 33/50; 331/74; 331/107 A; 331/108 R; 307/106
[58] Field of Search .................... 331/46, 50, 52, 53, 331/54, 74, 75, 76, 96, 107 R, 107 DP, 107 A, 108 R, 117 D; 307/106

[56] References Cited

U.S. PATENT DOCUMENTS

| 3,311,812 | 3/1967 | Geiszler et al. | 331/76 |
| 4,199,734 | 4/1980 | Dressen | 331/76 |
| 4,539,530 | 9/1985 | Mizumura et al. | 331/76 X |
| 4,638,263 | 1/1987 | van Rumpt et al. | 331/117 R |

FOREIGN PATENT DOCUMENTS 0190005  9/1985  Japan .................. 331/108 R

Primary Examiner—Eugene R. LaRoche
Assistant Examiner—David Mis
Attorney, Agent, or Firm—John Smith-Hill

[57] ABSTRACT

A circuit for generating a succession of fast rising voltage pulses comprises an inductor connected between first and second circuit nodes, a step recovery diode connected between a reference potential level and the first circuit node, and a current switch having a first state in which it conducts current in one direction with respect to the second circuit node and a second state in which it conducts current in the opposite direction with respect to the second circuit node. An oscillator is connected to the current switch for alternately and repeatedly placing the current switch in its first state and its second state. Preferably, the oscillator comprises a SAW resonator having a high Q and a parallel LC tank circuit having a low Q, connected in a closed positive feedback loop.

11 Claims, 3 Drawing Figures

COMB GENERATORS

This invention relates to comb generators.

BACKGROUND OF THE INVENTION

A signal comprising a single pulse having the waveform shown in FIG. 1(a) may be represented in the frequency domain by the spectrum shown in FIG. 1(b). The frequency $\omega_o$ at which the amplitude of the spectrum starts to roll off is determined by the rise time and fall time of the pulse. A signal which comprises a periodic succession of pulses each having the waveform shown in FIG. 1(a), for example as shown in FIG. 1(c), has the form of a comb when represented in the frequency domain (FIG. 1(d)). The shape of the envelope of the comb is determined by the single pulse's spectrum. The spacing between the lines of the FIG. 1(d) spectrum is equal to the reciprocal of the interval between successive pulses. Accordingly, a repetitive pulse-form signal having steep transitions may be used as an harmonic generator, and a selected harmonic component may be used as a reference in high resolution time interval measurements. However, interpulse jitter (variation in the interval between successive pulses) causes a broadening of the lines in the spectrum of the repetitive pulse-form signal and reduces the accuracy of time interval measurements carried out using that signal as a reference.

A step-recovery diode can be used to generate a pulse-form electrical signal having steep transitions, e.g. 200 mv/ps. However, the drive circuits that are at present available do not have sufficient short-term stability to take full advantage of the steep transitions that can be generated using a step-recovery diode.

Surface acoustic wave (SAW) resonators have a very high unloaded quality factor (Q). It is not uncommon for a SAW resonator to have a Q as high as 10,000 to 30,000. This makes the SAW resonator-based oscillator useful for generating signals which have good short-term frequency stability, i.e. have low interpulse jitter. However, SAW resonators have a very high insertion loss and insertion delay, and consequently it is difficult to start a conventional oscillator that employs a SAW resonator as its resonant circuit.

SUMMARY OF THE INVENTION

A preferred embodiment of the present invention in its first aspect is an oscillator which comprises a first resonator, a second resonator having a quality factor which is substantially lower than that of the first resonator, and a network connecting the first and second resonators in a closed positive feedback loop.

A preferred embodiment of the present invention in its second aspect is a circuit for generating a fast rising voltage pulse, the circuit comprising a step recovery diode connected between a reference potential level and a first circuit node, a current switch for conducting current selectively in two opposite directions with respect to a second circuit node, and an inductor connecting the first and second circuit nodes together.

A preferred embodiment of the invention in its third aspect is a circuit for generating a succession of fast rising voltage pulses, the circuit comprising a step recovery diode connected between a reference potential level and a first circuit node, a current switch having a first state in which it conducts current in one direction with respect to a second circuit node and a second state in which it conducts current in the opposite direction with respect to the second circuit node, an inductor connecting the first and second circuit nodes together, and an oscillator connected to the current switch for alternately and repeatedly placing the current switch in its first state and its second state.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 2:
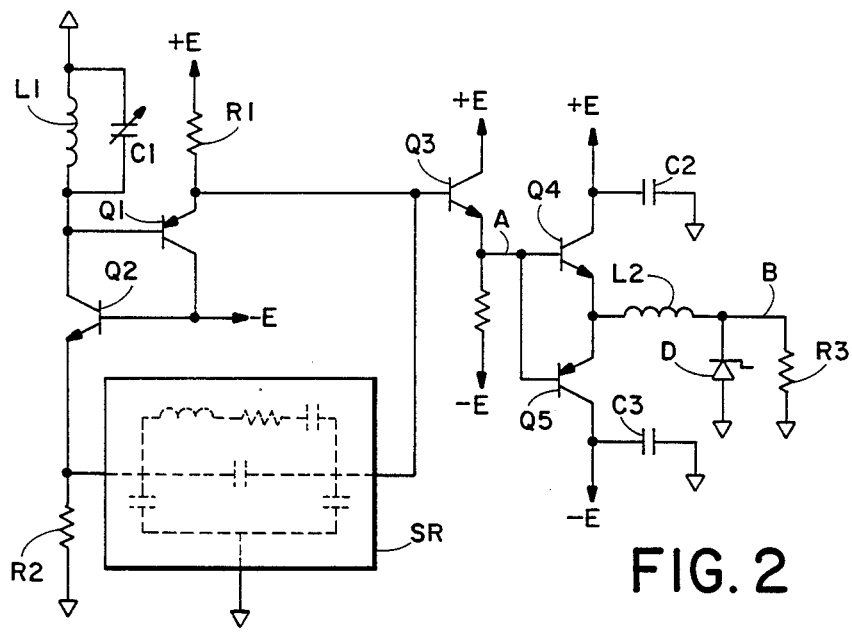
FIG. 2 is a schematic diagram of a SAW resonator-based oscillator connected to drive a step-recovery diode.

The circuit illustrated in FIG. 2 comprises a SAW resonator (SR) connected between the emitters of two bipolar transistors Q1 and Q2 which are connected together in base-collector coupled configuration. The emitters of the transistors Q1 and Q2 are connected to positive and negative reference potential levels $+E$ and $-E$ through respective biasing resistors R1 and R2. The collector of the transistor Q1 is connected to the negative reference potential level $-E$ while the collector of the transistor Q2 is connected to a tank circuit comprising an inductor L1 and a variable capacitor C1. The capacitor C1 is adjusted so that the resonant frequency of the tank circuit is substantially equal to the series resonant frequency of the SAW resonator. The tank circuit is designed to have a relatively low Q, about 3 or 4.

The SAW resonator SR has the equivalent circuit indicated in broken lines in FIG. 2. If the SAW resonator were replaced by a capacitor to provide d.c. isolation between the emitters of the transistors Q1 and Q2, and a series resistor of value equal to the resistance in the SAW resonator's equivalent circuit, the tank circuit L1, C1 and the transistors Q1 and Q2 would form a free-running oscillator, with positive feedback being provided from the emitter of the transistor Q2 to the emitter of the transistor Q1 by way of the resistor and capacitor connected in lieu of the SAW resonator. Since the Q of the tank circuit is quite small, the oscillation frequency of the free-running oscillator would not be very stable. However, in the circuit as actually shown in FIG. 2 the positive feedback is applied through the SAW resonator, which has a high unloaded Q (on the order of 10,000–30,000), and therefore the circuit as a whole has a high Q and the oscillation frequency of the circuit is stable. By incorporating the SAW resonator SR in the positive feedback loop of a free-running oscillator, the usual difficulty of starting an oscillator having a SAW resonator as its resonant element is avoided. The SAW resonator restricts the range of oscillation frequencies of the oscillator to its own range of resonant frequencies. Since the tank circuit L1, C1 has a low Q, the amplitude of oscillations at the emitter of the transistor Q1 does not vary strongly if the resonant frequency of the tank circuit drifts, e.g. due to temperature change.

The emitter of the transistor Q2 is connected to an output terminal A of the oscillator through an emitter follower transistor Q3. The output terminal A is connected to a current switch comprising an NPN transistor Q4 and a PNP transistor Q5. The collectors of the transistors Q4 and Q5 are connected to the positive and negative reference potential levels respectively, and are also connected to ground through decoupling capacitors C2 and C3. The bases of the transistors Q4 and Q5 are connected to the emitter of the transistor Q3. The current switch functions as a complementary emitter follower, providing a low output impedance regardless of whether the emitters of the transistors Q4 and Q5 are at a positive potential or a negative potential. When the emitter of the transistor Q3 goes high, the transistor Q4 turns on and the transistor Q5 turns off. Conversely, when the emitter of the transistor Q3 goes low, the transistor Q5 turns on and the transistor Q4 turns off. The emitters of the transistors Q4 and Q5 are connected to a step-recovery diode D through an inductor L2. The cathode of the diode D is also connected to an output terminal B which is connected to a load, represented by the resistor R3.

The inductance of the inductor 2 is very small, e.g. 20 nH, and in a practical implementation sufficient inductance may be provided simply by a bondwire. The inductor is shown in order to make it clear that some inductance is necessary between the emitters of the transistors Q4 and Q5 and the cathode of the diode D.

A step-recovery diode stores charge while conducting in the forward direction, and when the direction of current through the diode is suddenly reversed, the diode conducts current in the reverse direction for a short time, until the stored charge is removed. When the stored charge has been removed, the step-recovery diode abruptly cuts off the reverse current and the reverse bias voltage across the diode rises rapidly, with a rise time on the order of 35-50 ps.

Assuming that the voltage at the emitter of the transistor Q3 is initially negative, so that the transistors Q4 and Q5 are off and on respectively, the step-recovery diode D conducts current in the forward direction and the cathode of the diode D is at a negative potential. While the diode conducts in the forward direction, charge is being stored in the diode D. When the voltage at the bases of the transistors Q4 and Q5 rises, the transistor Q4 turns on and the transistor Q5 turns off. The forward current in the diode D decays to zero, and then the current supplied by the transistor Q4 through the inductor L2 causes the diode D to conduct current in the reverse direction. Conduction in the reverse direction continues for a short time, until the charge stored in the diode is removed, and the diode then abruptly becomes nonconductive and the potential at its cathode rises. The rise time is very short (35-50 ps). The current supplied by the transistor Q4 is diverted to the load resistor R4. When the emitter of the transistor Q3 goes negative once more, the transistor Q4 turns off and the transistor Q5 turns on. After decay of the current in the inductor L2, the transistor Q5 draws current through the inductor L2 and the diode D is once more forced to conduct in the forward direction.

Figure 1:
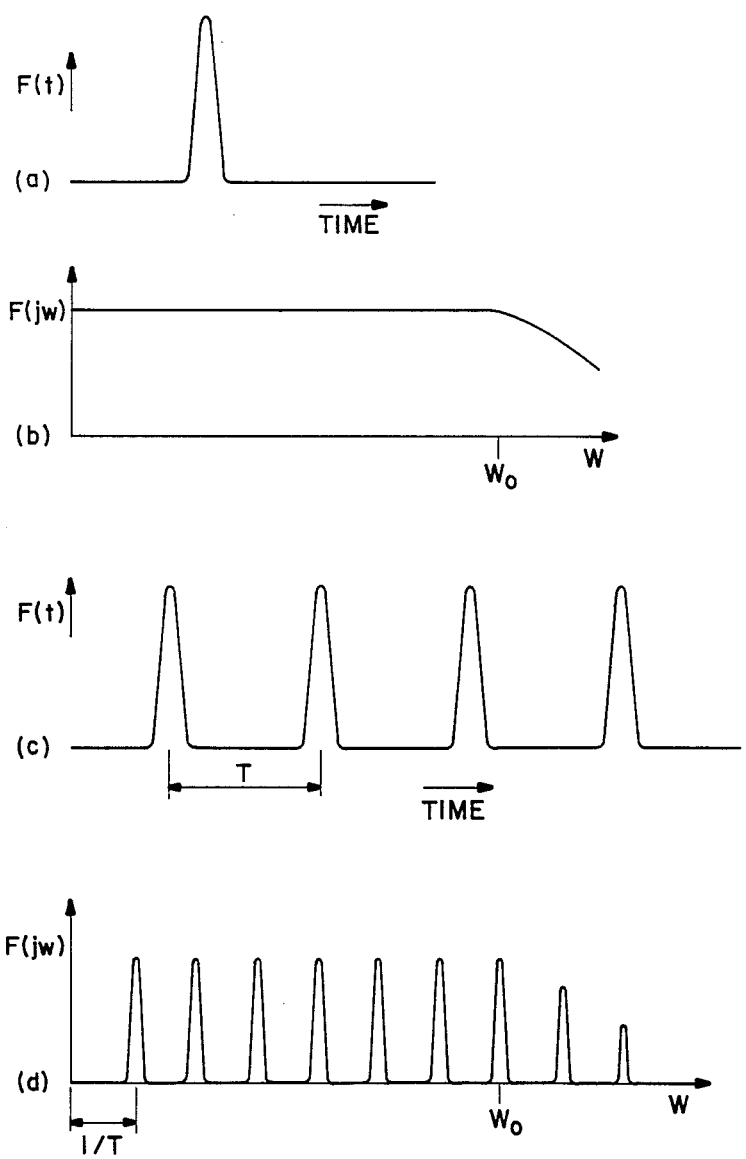
FIG. 1 shows waveforms to illustrate operation of a comb generator.
Figure 3:
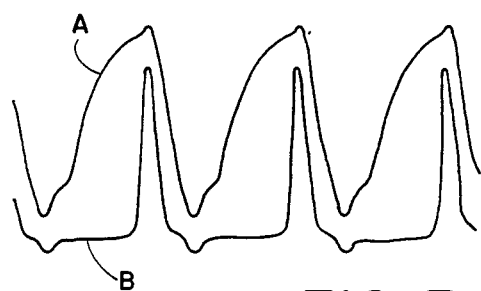
FIG. 3 illustrates voltage waveforms at two points of the FIG. 2 circuit.

The curve A shown in FIG. 3 represents the voltage waveform at the output terminal A of the oscillator, and the curve B represents the voltage waveform at the terminal B. It will be seen that the transitions at the terminal B are very fast. Through use of a SAW resonator based oscillator to drive the current switch Q4, Q5, the pulses at the terminal B occur with very low interpulse jitter. Therefore, when the signal at the terminal B is represented in the frequency domain it has very narrow peaks, and the peaks have uniform amplitude to very high frequencies. Therefore, the circuit illustrated in FIG. 1 is well suited for use as a comb generator.

It will be appreciated that the present invention is not restricted to the particular circuit that has been described and illustrated with reference to FIG. 1, and that variations may be made therein without departing from the scope of the invention as defined in the appended claims and equivalents thereof. In particular, the oscillator comprising the tank circuit L1, C1 and the SAW resonator is usable independently of the driver circuit for the step-recovery diode D1, and the driver circuit for the step-recovery diode is usable independently of the oscillator circuit.

We claim:

1. An oscillator comprising a first resonator, a second resonator having a quality factor which is substantially smaller than that of the first resonator, and means connecting the first and second resonators in a closed positive feedback loop, said first resonator being a surface acoustic wave resonator.

2. An oscillator according to claim 1, wherein each resonator has two terminals and the means connecting the first and second resonators comprise first and second bipolar transistors of opposite type, the first transistor having its emitter connected to one terminal of the first resonator, its base connected to one terminal of the second resonator, and its collector connected to the base of the second transistor, and the second transistor having its emitter connected to the second terminal of the first resonator, and its collector connected to the base of the first transistor.

3. An oscillator according to claim 2, wherein the second resonator is a parallel combination of an inductor and a capacitor connected between the first and second terminals of the second resonator, the first terminal of the second resonator being connected to a reference potential level and the second terminal thereof being connected to the base of the first transistor.

4. A circuit for generating a fast rising voltage pulse, comprising a step recovery diode connected between a reference potential level and a first circuit node, a current switch for conducting current selectively in two opposite directions with respect to a second circuit node, and an inductor connecting the first and second circuit nodes together.

5. A circuit according to claim 4, wherein the current switch comprises first and second bipolar transistors of opposite type, the bases of the first and second transistors being connected together and the emitters of the first and second transistors being connected to the second circuit node.

6. A circuit for generating a succession of fast rising voltage pulses, comprising a step recovery diode connected between a reference potential level and a first circuit node, a current switch having a first state in which it conducts current in one direction with respect to a second circuit node and a second state in which it conducts current in the opposite direction with respect to said second circuit node, an inductor connecting the first and second circuit nodes together, and an oscillator connected to the current switch for alternately and repeatedly placing the current switch in its first state and its second state.

7. A circuit according to claim 6, wherein the oscillator comprises a first resonator, a second resonator having a quality factor that is substantially lower than the first resonator, and means connecting the first and second resonators in a closed positive feedback loop.

8. A circuit according to claim 7, wherein the first resonator is a surface acoustic wave resistor.

9. An oscillator comprising:

a first resonator which has two terminals, a second resonator which has two terminals and has a quality factor which is substantially smaller than that of the first resonator, a first bipolar transistor having its emitter connected to one terminal of the first resonator and its base connected to one terminal of the second resonator, and a second bipolar transistor having its emitter connected to the second terminal of the first resonator, its base connected to the collector of the first transistor, and its collector connected to the base of the first transistor.

10. An oscillator according to claim 9, wherein the first resonator is a surface acoustic wave resonator.

11. An oscillator according to claim 9, wherein the second resonator is a parallel combination of an inductor and a capacitor connected between the first and second terminals of the second resonator, the first terminal of the second resonator being connected to a reference potential level and the second terminal thereof being connected to the base of the first transistor.

* * * * *